US012080778B2

(12) United States Patent
Liu et al.

(10) Patent No.: US 12,080,778 B2
(45) Date of Patent: Sep. 3, 2024

(54) HIGH ELECTRON MOBILITY TRANSISTOR

(71) Applicant: UNITED MICROELECTRONICS CORP., Hsin-Chu (TW)

(72) Inventors: An-Chi Liu, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/238,534

(22) Filed: Aug. 28, 2023

(65) Prior Publication Data

US 2023/0402527 A1 Dec. 14, 2023

Related U.S. Application Data

(63) Continuation of application No. 17/705,416, filed on Mar. 28, 2022, now Pat. No. 11,784,238, which is a continuation of application No. 16/601,570, filed on Oct. 14, 2019, now Pat. No. 11,322,600.

(30) Foreign Application Priority Data

Sep. 17, 2019 (CN) ......................... 201910874778.8

(51) Int. Cl.
| | | |
|---|---|---|
| H01L 29/778 | (2006.01) | |
| H01L 29/20 | (2006.01) | |
| H01L 29/201 | (2006.01) | |
| H01L 29/40 | (2006.01) | |
| H01L 29/66 | (2006.01) | |

(52) U.S. Cl.
CPC .... *H01L 29/66462* (2013.01); *H01L 29/2003* (2013.01); *H01L 29/201* (2013.01); *H01L 29/404* (2013.01); *H01L 29/778* (2013.01)

(58) Field of Classification Search
CPC ........... H01L 29/66462; H01L 29/2003; H01L 29/201; H01L 29/404; H01L 29/778; H01L 21/31111; H01L 21/31116; H01L 29/1066; H01L 29/42316; H01L 29/7786; H01L 29/0603; H01L 29/42356
See application file for complete search history.

(56) References Cited

U.S. PATENT DOCUMENTS

| | | | |
|---|---|---|---|
| 6,521,961 B1 * | 2/2003 | Costa | ............... H01L 29/66871 257/42 |
| 7,560,325 B1 | 7/2009 | Merrett | |
| 8,604,540 B2 | 12/2013 | Malhan | |
| 9,041,064 B2 | 5/2015 | Wu et al. | |
| 9,379,191 B2 | 6/2016 | Hsu et al. | |
| 9,741,840 B1 | 8/2017 | Moens | |

(Continued)

FOREIGN PATENT DOCUMENTS

| | | |
|---|---|---|
| CN | 101273458 A | 9/2008 |
| CN | 104377240 A | 2/2015 |

(Continued)

*Primary Examiner* — Samuel Park
(74) *Attorney, Agent, or Firm* — Winston Hsu

(57) ABSTRACT

A high electron mobility transistor (HEMT) includes a buffer layer on a substrate, a barrier layer on the buffer layer, a gate electrode on the barrier layer, a field plate adjacent to two sides of the gate electrode, and a first passivation layer adjacent to two sides of the gate electrode. Preferably, a sidewall of the field plate includes a first curve.

10 Claims, 3 Drawing Sheets

(56) References Cited

U.S. PATENT DOCUMENTS

| | | | |
|---|---|---|---|
| 2005/0133818 A1* | 6/2005 | Johnson | H01L 21/28587 257/E29.338 |
| 2006/0060871 A1 | 3/2006 | Beach | |
| 2009/0050937 A1 | 2/2009 | Murata | |
| 2009/0057720 A1 | 3/2009 | Kaneko | |
| 2009/0078966 A1 | 3/2009 | Asai | |
| 2010/0102357 A1 | 4/2010 | Sato | |
| 2010/0129992 A1* | 5/2010 | Murata | H01L 29/66871 257/E21.09 |
| 2010/0244018 A1 | 9/2010 | Kaneko | |
| 2010/0330754 A1 | 12/2010 | Hebert | |
| 2011/0233538 A1 | 9/2011 | Iwakami | |
| 2012/0261720 A1* | 10/2012 | Puglisi | H01L 29/42376 257/E21.403 |
| 2015/0048419 A1 | 2/2015 | Okamoto | |
| 2015/0187925 A1* | 7/2015 | Cheng | H01L 29/7789 257/76 |
| 2017/0047437 A1* | 2/2017 | Nakayama | H01L 21/2258 |
| 2019/0206998 A1 | 7/2019 | Huang | |
| 2019/0244823 A1* | 8/2019 | Yoshida | H01L 29/401 |
| 2019/0371909 A1* | 12/2019 | Banerjee | H01L 29/66462 |
| 2020/0044067 A1 | 2/2020 | Banerjee | |
| 2020/0321447 A1* | 10/2020 | Ostermaier | H01L 29/4236 |

FOREIGN PATENT DOCUMENTS

| | | |
|---|---|---|
| CN | 207303109 U | 5/2018 |
| JP | 2008-306083 A | 12/2008 |
| TW | I528549 | 4/2016 |
| WO | 2017/200827 | 11/2017 |

\* cited by examiner

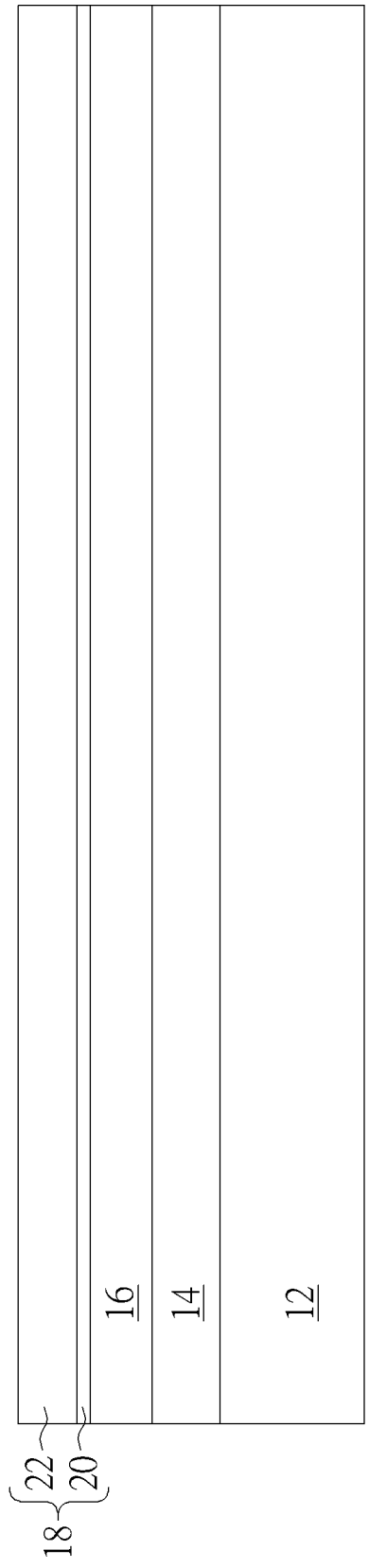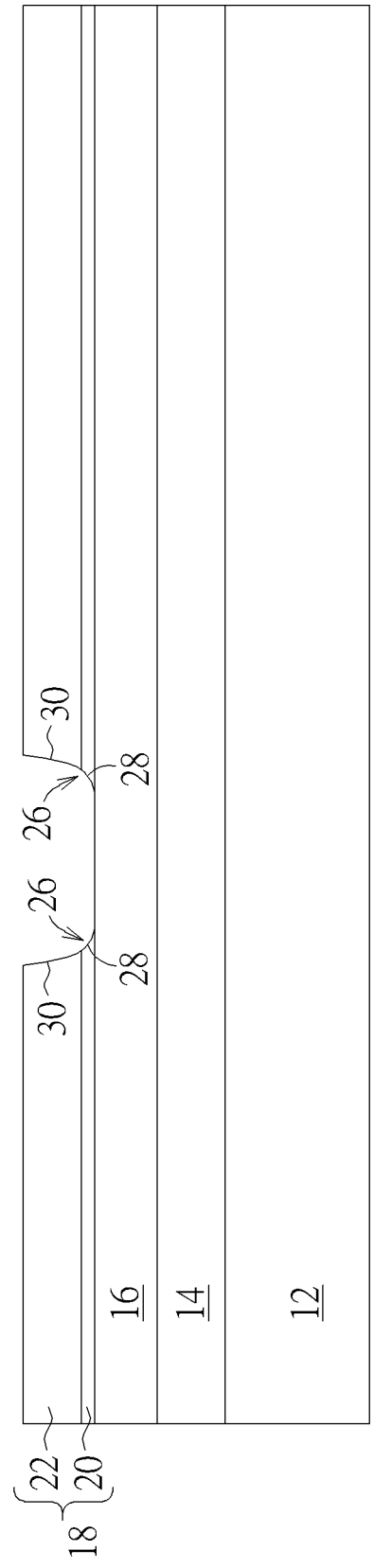

HIGH ELECTRON MOBILITY TRANSISTOR

CROSS REFERENCE TO RELATED APPLICATIONS

This application is a continuation application of U.S. application Ser. No. 17/705,416, filed on Mar. 28, 2022, which is a continuation application of U.S. application Ser. No. 16/601,570, filed on Oct. 14, 2019. The contents of these applications are incorporated herein by reference.

BACKGROUND OF THE INVENTION

1. Field of the Invention

The invention relates to a high electron mobility transistor (HEMT).

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a high electron mobility transistor (HEMT) includes a buffer layer on a substrate, a barrier layer on the buffer layer, a gate electrode on the barrier layer, a field plate adjacent to two sides of the gate electrode, and a first passivation layer adjacent to two sides of the gate electrode. Preferably, a sidewall of the field plate includes a first curve.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4 illustrate a method for fabricating a HEMT according to an embodiment of the present invention.

DETAILED DESCRIPTION

Figure 3:
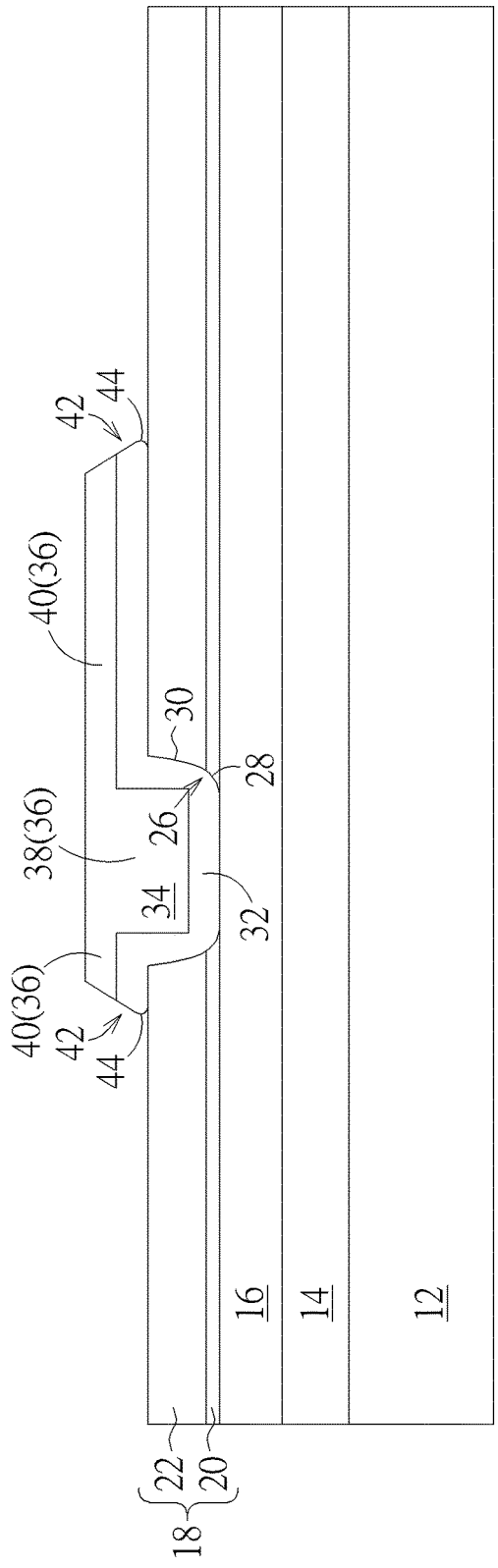

Referring to the FIGS. 1-4, FIGS. 1-4 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14. In this embodiment, the barrier layer 16 is preferably made of III-V semiconductor such as aluminum gallium nitride ($Al_xGa_{1-x}N$), in which 0<x<1 and the barrier layer 16 preferably includes an epitaxial layer formed through epitaxial growth process. Similar to the buffer layer 14, the formation of the barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a passivation layer 18 including a passivation layer 20 and another passivation layer 22 are formed on the surface of the barrier layer 16. In this embodiment, the passivation layer 20 and the passivation layer 22 are preferably made of different materials, in which the passivation layer 20 preferably includes aluminum nitride (AlN), aluminum oxide (AlO), silicon carbide (SiC), silicon oxynitride (SiON), or combination thereof while the passivation layer 22 preferably includes silicon nitride. It should be noted that even though the passivation layer 18 formed on the surface of the barrier layer 16 is a dual-layer structure in this embodiment, according to other embodiments of the present invention, it would also be desirable to form a passivation layer 18 made of a single-layered structure on the surface of the barrier layer 16, in which the single-layered structure could include either one of the aforementioned passivation layer 20 or the passivation layer 22, which are all within the scope of the present invention.

Next, as shown in FIG. 2, a pattern transfer process is conducted by first forming a patterned mask (not shown) such as a patterned resist on the surface of the passivation layer 18, and one or more etching process could be conducted to remove part of the passivation layer 22 and part of the passivation layer 20 to form a recess 24 exposing the surface of the barrier layer 16. Specifically, a dry etching process and a wet etching process are conducted sequentially to remove part of the passivation layer 18 to form the recess 24, in which the dry etching process could include etching gas such as but not limited to for example tetrafluoromethane ($CF_4$), trifluoromethane ($CHF_3$), and/or helium gas ($H_2$) and the wet etching process could include agent such as diluted hydrofluoric acid (dHF). In this embodiment, the flow of $CF_4$ is preferably between 30-100 sccm, the flow of $CHF_3$ is between 30-100 sccm, the flow of $H_2$ is preferably between 160-180 sccm, and the ratio of dHF is preferably at around 100:1.

It should be noted that the aforementioned dry etching process and wet etching process employed to form the recess 24 preferably trim the two corners 26 at the bottom of the recess 24 exposing the passivation layer 20 to form curves 28 while the bottom surface directly under the recess 24 is etched to have a completely planar surface or curved surface depending on the recipe of the etching process. In other words, in contrast to bottom corners of the recess fabricated from conventional art having acute or obtuse angles formed from two linear or straight lines, the present embodiment preferably conducts the aforementioned dry etching and wet etching process with desirable recipe to trim or reshape the two bottom corners 26 of the recess 24 from acute or obtuse angles to curves 28 or curved surfaces. Preferably, the transition point from the two inclined and planar sidewalls 30 adjacent to two sides of the recess 24 to the curves 28 is slightly above the contact spot between the passivation layer 20 and the passivation layer 22. In other words, the inclined sidewalls 30 of the recess 24 above the transition point are preferably planar while the sidewalls of the 24 below the transition point include curved surfaces. According to a preferred embodiment of the present invention, corners of the recess 24 having curves 28 could be used to prevent gate electrode formed afterwards from causing point or corona discharge and affect the performance of the device.

Next, as shown in FIG. 3, a p-type semiconductor layer 32 and a gate material layer 34 are formed on the surface of the passivation layer 20 and filled into the recess 24, and a photo-etching process is conducted to remove part of the gate material layer 34 and part of the p-type semiconductor layer 32 to form a gate structure 36 on the barrier layer 16 and passivation layer 18, in which the gate structure 36 after the patterning or photo-etching process preferably includes a gate electrode 38 and a field plate 40 adjacent to two sides of the gate electrode 38. Specifically, the gate material layer 34 formed within the aforementioned recess 24 preferably becomes the gate electrode 38 while the gate material layer 34 above the passivation layer 18 and adjacent to two sides of the gate electrode 38 becomes the field plate 40, in which the gate electrode 38 and field plate 40 are made of same material. Preferably, the gate electrode 38 serves as a switch for turning on and turning off the channel region and the field plate 40 serves to direct the electrical field upward while balancing and diffusing the large current being directed so that the sustainable voltage of the device could increase substantially. In this embodiment, the p-type semiconductor layer 32 preferably includes p-type GaN (p-GaN) and the gate material layer 34 preferably includes Schottky metal including but not limited to for example gold, silver, and/or platinum.

It should be noted that during the patterning of the gate material layer 34 and the p-type semiconductor layer 32, a dry etching process and a wet etching process are preferably conducted to remove part of the gate material layer 34 and part of the p-type semiconductor layer 32 to form the gate electrode 38 and the field plate 40, in which the dry etching process could include gases including but not limited to for example methane (CH$_4$) and/or chlorine gas (Cl$_2$) and the wet etching process could include hydroxylamine. In this embodiment, the flow of the methane is preferably between 10-100 sccm and the flow of Cl$_2$ is between 10-100 sccm. According to an embodiment of the present invention, after the gate electrode 38 and field plate 40 are formed it would also be desirable to selectively conduct an extra anneal process by using hydrogen gas and/or nitrogen gas at around 400° C. to fix or maintain the pattern of the p-type semiconductor layer 32 and gate material layer 34.

Moreover, it should further be noted that when the aforementioned etching processes were conducted, it would be desirable to conduct the dry etching process to trim the sidewalls of the p-type semiconductor layer 32 and gate material layer 34 and then conduct the wet etching process to transform corners 42 of the p-type semiconductor layer 32 directly on top of the passivation layer 18 into curves 44. In other words, in contrast to bottom corners of the patterned p-type semiconductor layer fabricated from conventional approach having acute or obtuse angles formed from two liner or straight lines, the present embodiment preferably uses the aforementioned etching processes to reshape the two bottom corners 42 of the p-type semiconductor layer 32 directly above the passivation layer 18 from acute or obtuse angles to curves 44.

Figure 4:
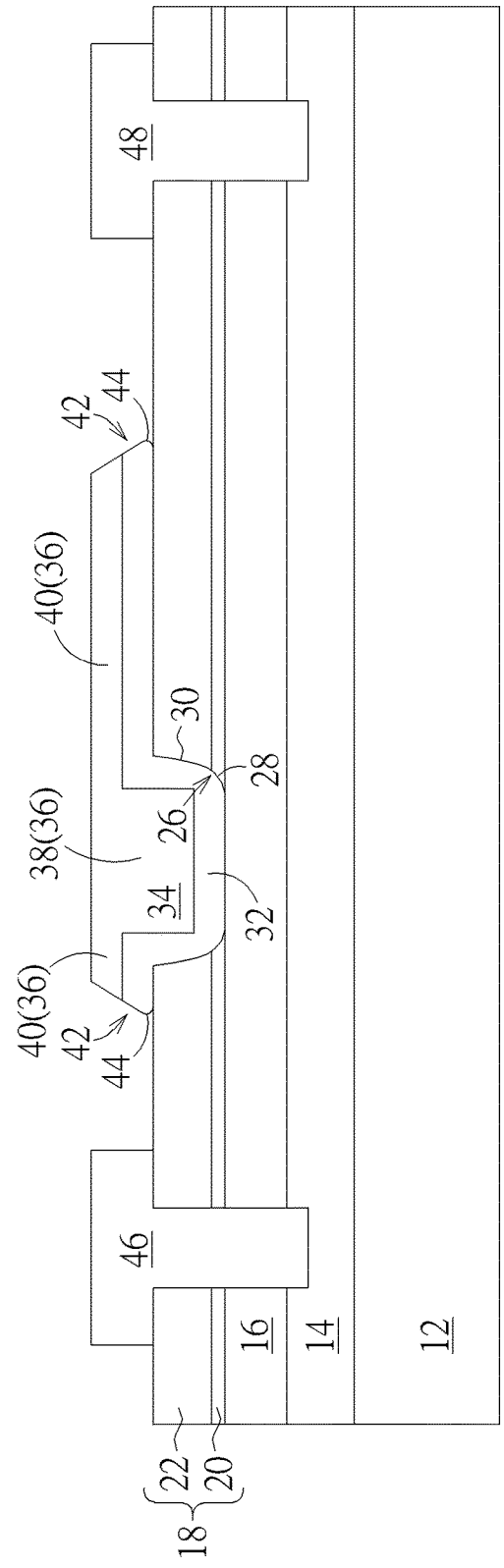

Next, as shown in FIG. 4, a source electrode 46 and a drain electrode 48 are formed adjacent to two sides of the gate structure 36. In this embodiment, the source electrode 46 and the drain electrode 48 are preferably made of metal. Nevertheless, in contrast to the gate electrode 38 and field plate 40 made of Schottky metal, the source electrode 46 and the drain electrode 48 are preferably made of ohmic contact metals. According to an embodiment of the present invention, each of the source electrode 46 and drain electrode 48 could include titanium (Ti), aluminum (Al), tungsten (W), palladium (Pd), or combination thereof. Moreover, it would be desirable to first conduct a photo-etching process to remove part of the passivation layer 18, part of the barrier layer 16, and part of the buffer layer 14 adjacent to two sides of the gate structure 36 for forming recesses, conduct an electroplating process, sputtering process, resistance heating evaporation process, electron beam evaporation process, physical vapor deposition (PVD) process, chemical vapor deposition (CVD) process, or combination thereof to form electrode materials in the recess, and then pattern the electrode materials through etching process to form the source electrode 46 and the drain electrode 48.

Referring again to FIG. 4, FIG. 4 further illustrates a structural view of a HEMT according to an embodiment of the present invention. As shown in FIG. 4, the HEMT preferably includes a buffer layer 14 disposed on the substrate 12, a barrier layer 16 disposed on the buffer layer 14, a gate electrode 38 disposed on the barrier layer 16, a passivation layer 18 disposed adjacent to two sides of the gate electrode 38, a field plate 40 disposed on the barrier layer 16 and passivation layer 18 adjacent to two sides of the gate electrode 38, and a p-type semiconductor layer 32 disposed between the gate electrode 38 and barrier layer 16. Preferably, the passivation layer 18 includes a dual-layered structure having a passivation layer 20 and passivation layer 22, in which the passivation layer 20 includes aluminum nitride (AlN), aluminum oxide (AlO), silicon carbide (SiC), silicon oxynitride (SiON), or combination thereof and the passivation layer 22 includes silicon nitride.

In this embodiment, at least one of the two corners 26 directly contacted between the p-type semiconductor layer 32 and sidewalls of the passivation layer 20 includes a curve 28 or curved surface and at the same time another corner 42 or corners 42 of the p-type semiconductor layer 32 directly on the passivation layer 22 includes another curve 44, in which the two curves 28, 44 could be used to prevent gate structure from causing point or corona discharge and affect the performance of the device. It should be noted that even though the bottom surface of the p-type semiconductor layer 32 directly contacting the barrier layer 16 pertains to be a planar surface in this embodiment, according to another embodiment of the present invention it would also be desirable to adjust the recipe or parameter of the etching process conducted in FIG. 2 for forming the recess 24 so that the bottom surface of the p-type semiconductor layer 32 contacting the barrier layer 16 could include a curved surface, which is also within the scope of the present invention.

Figure 5:
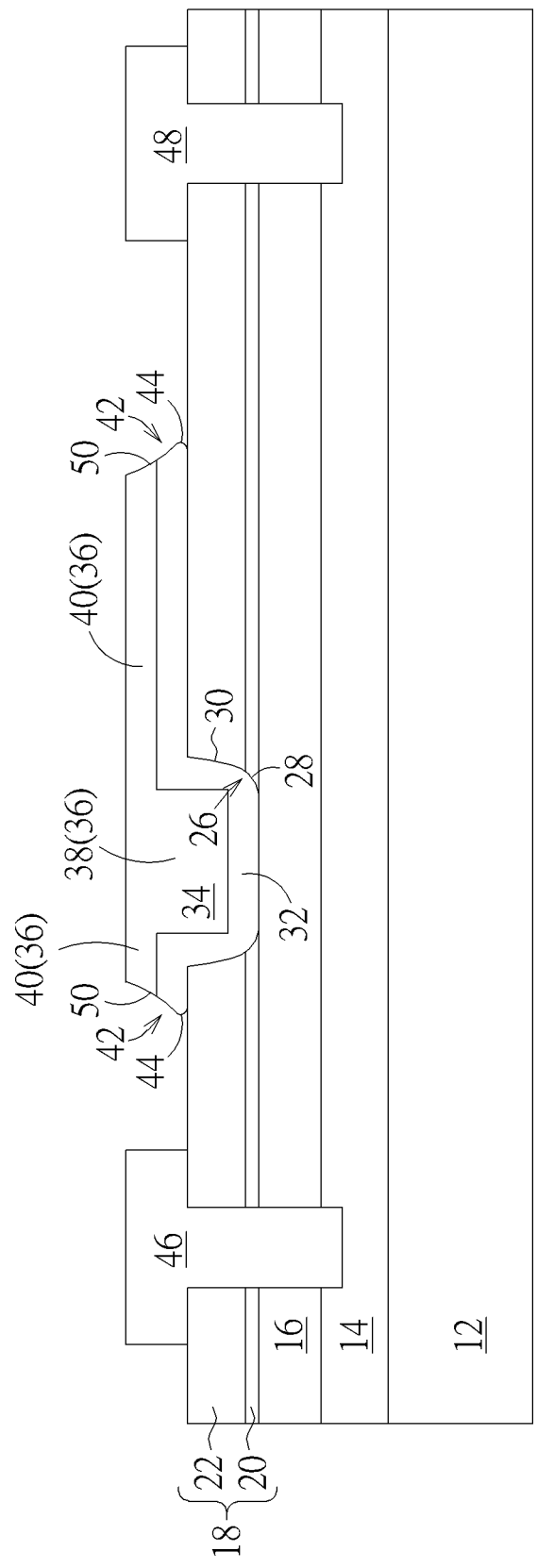
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, in contrast to sidewalls of the field plate from the previously embodiment having planar and inclined sidewalls, according to an embodiment of the present invention, it would also be desirable to adjust the recipe or parameter of the etching process conducted in FIG. 3 during the formation of the gate electrode 38 and field plate 40 to form p-type field plate 40 and/or p-type semiconductor layer 32 having curved sidewalls or more specifically sidewalls concave upward, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
    a buffer layer on a substrate;
    a barrier layer on the buffer layer;
    a gate electrode on the barrier layer;
    a field plate adjacent to two sides of the gate electrode, wherein a top surface of the gate electrode is even with a top surface of the field plate and a sidewall of the field plate comprises a first curve;
    a first passivation layer adjacent to two sides of the gate electrode; and
    a p-type semiconductor layer between the gate electrode and the barrier layer and directly contacting the first passivation layer, wherein a sidewall of the p-type semiconductor layer comprises a second curve and the first curve is connected to the second curve.

2. The HEMT of claim 1, wherein the buffer layer comprises a group III-V semiconductor.

3. The HEMT of claim 2, wherein the buffer layer comprises gallium nitride (GaN).

4. The HEMT of claim 1, wherein the barrier layer comprises $Al_xGa_{1-x}N$.

5. The HEMT of claim 1, wherein the first passivation layer comprises silicon nitride.

6. The HEMT of claim 1, further comprising a second passivation layer between the first passivation layer and the barrier layer.

7. The HEMT of claim 6, wherein the second passivation layer comprises aluminum nitride, aluminum oxide, silicon carbide, or silicon oxynitride.

8. The HEMT of claim 1, wherein the p-type semiconductor layer comprises p-type gallium nitride (p-GaN).

9. The HEMT of claim 1, wherein a bottom surface of the p-type semiconductor layer comprises a third curve.

10. The HEMT of claim 1, wherein the field plate and the gate electrode comprise a same material.

* * * * *